(12) United States Patent
Kagami et al.

(10) Patent No.: US 7,950,135 B2
(45) Date of Patent: May 31, 2011

(54) MANUFACTURING METHOD OF MAGNETORESISTIVE EFFECT ELEMENT

(75) Inventors: Takeo Kagami, Chuo-ku (JP); Takayasu Kanaya, Chuo-ku (JP)

(73) Assignee: TDK Corporation, Tokyo (JP)

( * ) Notice: Subject to any disclaimer, the term of this patent is extended or adjusted under 35 U.S.C. 154(b) by 783 days.

(21) Appl. No.: 11/806,518

(22) Filed: May 31, 2007

(65) Prior Publication Data

US 2007/0289122 A1 Dec. 20, 2007

(30) Foreign Application Priority Data

Jun. 16, 2006 (JP) .................. 2006-167432

(51) Int. Cl.
*G11B 5/127* (2006.01)
*H04R 31/00* (2006.01)

(52) U.S. Cl. ............... 29/603.11; 29/603.13; 29/603.14; 29/603.16; 29/603.18; 216/22; 216/48; 360/324.1; 360/324.11; 360/324.12; 360/324.2; 427/127; 427/128; 427/129; 427/130; 427/131

(58) Field of Classification Search ............... 29/603.07, 29/603.09, 603.13, 603.14, 417, 846, 850, 29/854; 216/22, 48; 360/324.1, 324.11, 360/324.12, 324.2; 427/127–131

See application file for complete search history.

(56) References Cited

U.S. PATENT DOCUMENTS

| 6,353,318 | B1 * | 3/2002 | Sin et al. ........................ 324/252 |
| 6,421,212 | B1 * | 7/2002 | Gibbons et al. .......... 360/327.31 |
| 6,669,983 | B2 | 12/2003 | Kagami et al. |
| 7,173,797 | B2 * | 2/2007 | Sbiaa ........................ 360/324.11 |
| 7,333,304 | B2 * | 2/2008 | Gill et al. ................. 360/324.12 |

FOREIGN PATENT DOCUMENTS

| JP | 10-021511 A | 1/1998 |
| JP | 2002-151756 A | 5/2002 |
| JP | 2002-299726 A | 10/2002 |
| JP | 2003-086861 A | 3/2003 |
| JP | 2004-031544 | 1/2004 |
| JP | 2004-103809 | 4/2004 |

OTHER PUBLICATIONS

Japanese Patent Office citation in copending application, Apr. 22, 2008.

* cited by examiner

*Primary Examiner* — Paul D Kim

(74) *Attorney, Agent, or Firm* — Frommer Lawrence & Haug LLP

(57) ABSTRACT

A manufacturing method of an MR element in which current flows in a direction perpendicular to layer planes, includes a step of forming on a lower electrode layer an MR multi-layered structure with side surfaces substantially perpendicular to the layer lamination plane, a step of forming a first insulation layer on at least the side surfaces of the formed MR multi-layered structure, a step of forming a second insulation layer and a magnetic domain control bias layer on the lower electrode layer, and a step of forming an upper electrode layer on the MR multi-layered structure and the magnetic domain control bias layer.

14 Claims, 4 Drawing Sheets

MANUFACTURING METHOD OF MAGNETORESISTIVE EFFECT ELEMENT

PRIORITY CLAIM

This application claims priority from Japanese patent application No. 2006-167432, filed on Jun. 16, 2006, which is incorporated herein by reference.

BACKGROUND OF THE INVENTION

1. Field of the Invention

The present invention relates to a method for manufacturing a magnetoresistive effect (MR) element, to a method for manufacturing a thin-film magnetic head with an MR element, and to a thin-film magnetic head with an MR element.

2. Description of the Related Art

As hard disk drive apparatuses (HDD) increase in capacity and reduce in size, highly sensitive and high-output thin-film magnetic heads are being demanded. In order to satisfy the demand, performance of giant magnetoresistive effect (GMR) thin-film magnetic heads with GMR read head elements are being improved. On the other hand, tunnel magnetoresistive effect (TMR) thin-film magnetic heads with TMR read head elements having a magnetoresistivity ratio more than twice as high as that of the GMR thin-film magnetic heads are being developed.

TMR thin-film heads differ from conventional GMR thin-film magnetic head in head structure because of the difference in the flowing direction of sense current. The head structure in which sense current flows in a direction parallel to the layer planes or film planes as in typical GMR thin-film heads is called as CIP (Current In Plane) structure, whereas the structure in which sense current flows in a direction perpendicular to the film planes as in TMR thin-film magnetic heads is called as CPP (Current Perpendicular to Plane) structure, respectively.

In fabrication of a GMR thin-film magnetic head with the CPP structure or a TMR thin-film magnetic head, it is important to ensure the flatness of a lower shield layer or lower electrode layer and an upper shield layer or upper electrode layer in order to improve the stability of the MR element.

If the upper shield layer is not flat but has asperities, coupling between this upper shield layer and a magnetization free layer or a free layer in the MR multi-layered structure may induce unstable operations of the MR element. Also, such asperities in the upper shield layer will induce lowering of the resolution of the MR element causing difficulty for high recording density.

The applicants of this application have proposed a method for manufacturing a thin-film magnetic head, having a step of depositing an MR multi-layer, a step of patterning the deposited MR multi-layer by milling with a mask to form an MR multi-layered structure, a step of depositing an insulation layer on a cap layer and a lower electrode layer at the top of the formed MR multi-layered structure, a step of planarizing the deposited insulation layer until the cap layer of the MR multi-layered structure is exposed, and a step of forming an upper electrode layer on the planarized insulation layer and MR multi-layered structure (U.S. Pat. No. 6,669,983 B2).

The manufacturing method described in U.S. Pat. No. 6,669,983 B2 is advantageous in that the upper electrode layer can be planarized. However, it is required to perform a planarization process such as chemical-mechanical polishing (CMP) and it is necessary to form the cap layer considerably thick at the top of the MR multi-layered structure.

SUMMARY OF THE INVENTION

It is therefore an object of the present invention to provide a method for manufacturing an MR element and a method for manufacturing a thin-film magnetic head, whereby an upper electrode layer in an MR multi-layered structure can be planarized with performing no planarization process or by performing an extremely easy planarization process, and to provide a thin-film magnetic head manufactured using these methods.

Another object of the present invention is to provide a method for manufacturing an MR element, a method for manufacturing a thin-film magnetic head and a thin-film magnetic head, whereby sufficient bias field for magnetic domain control can be provided to a free layer in an MR multi-layered structure.

According to the present invention, a manufacturing method of an MR element in which current flows in a direction perpendicular to layer planes, includes a step of forming on a lower electrode layer an MR multi-layered structure with side surfaces substantially perpendicular to the layer lamination plane, a step of forming a first insulation layer on at least the side surfaces of the formed MR multi-layered structure, a step of forming a second insulation layer and a magnetic domain control bias layer on the lower electrode layer, and a step of forming an upper electrode layer on the MR multi-layered structure and the magnetic domain control bias layer.

In this specification, "substantially perpendicular" means "perpendicular" or "angle near perpendicular" that can be expected to obtain the similar effect as in "perpendicular".

As aforementioned, according to the present invention, the side surfaces of the MR multi-layered structure are formed substantially perpendicular to the layer lamination plane, the first insulation layer is formed on at least the side surfaces of the MR multi-layered structure and the second insulation layer is formed in a region on the lower electrode layer, where no MR multi-layered structure is formed. The magnetic domain control bias layer is formed on this second insulation layer.

If, as the conventional art, the side surfaces (side surfaces in a track-width direction or lateral edges when this MR multi-layered structure is seen from an air nearing surface (ABS)) of the MR multi-layered structure incline, in other words, if the side surfaces of the MR multi-layered structure are tapered, a bottom gap layer that is an insulation layer as an under layer for the magnetic domain control bias layer will be deposited on the side surfaces of the MR multi-layered structure. Due to such bottom gap layer formed on the side surfaces, an upper surface of the magnetic domain control bias layer formed on the bottom gap layer will not become flat and thus it is required to perform a planarization process such as polishing. Also, due to the thick bottom gap layer formed on the side surfaces, the magnetic coupling between the magnetic domain control bias layer and the free layer of the MR multi-layered structure will weaken and therefore it is impossible to provide sufficient magnetic domain control.

Contrary to this, according to the present invention, because the side surfaces of the MR multi-layered structure are substantially perpendicular to the layer lamination plane, a bottom gap layer that is the second insulation layer and also the magnetic domain control bias layer formed thereon are hardly deposited on the side surfaces of the MR multi-layered structure. Thus, the upper surfaces of the formed TMR multi-layered structure and the formed magnetic domain control bias layer become almost flat, and therefore no planarization process is necessary to perform or if performed a simple planarization process is enough.

Because the side surfaces are substantially perpendicular to the layer lamination plane, the second insulation layer is hardly deposited on the side surfaces. Thus, the first insulation layer for electrically insulating the side surfaces of the TMR multi-layered structure from the magnetic domain control bias layer is formed on these side surfaces in a deposition process different from that of the second insulation layer. Since the first insulation layer is deposited in the different process from the second insulation layer, this first insulation layer can be formed to have a quite thinner thickness than that of the second insulation layer. As a result, it is possible to increase the magnetic coupling between the magnetic domain control bias layer and the magnetization free layer of the TMR multi-layered structure so as to perform sufficient magnetic domain control of the free layer. Further, since the second insulation layer is deposited in the different process from the first insulation layer, a thickness of the second insulation layer can be optionally adjusted so that the position of the magnetic domain control bias layer along the thickness coincides to that of the magnetization free layer of the TMR multi-layered structure.

It is preferred that the step of forming a second insulation layer is performed after the step of forming a first insulation layer, or that the step of forming a second insulation layer is performed before the step of forming a first insulation layer.

It is also preferred that the step of forming an MR multi-layered structure includes depositing on the lower electrode layer a magnetoresistive effect multi-layered film, forming a mask on the deposited MR multi-layered film, and milling through the mask using beam in a direction substantially perpendicular to the layer lamination plane so as to form the MR multi-layered structure with the side surfaces.

It is further preferred that the step of forming a first insulation layer includes depositing a film for the first insulation layer on at least the side surfaces of the formed MR multi-layered structure through the mask, and forming the first insulation layer by performing a lift off process of the mask.

It is also preferred that the step of forming a second insulation layer and a magnetic domain control bias layer includes depositing a film for the second insulation layer and a film for the magnetic domain control bias layer through the mask, and forming the second insulation layer and the magnetic domain control bias layer by performing a lift off process of the mask.

It is further preferred that upper surfaces of the MR multi-layered structure and the magnetic domain control bias layer are planarized by performing the lift off process of the mask.

It is still further preferred that upper surfaces of the MR multi-layered structure and the magnetic domain control bias layer are planarized by performing a CMP process.

It is quite preferred that the first insulation layer is formed thinner than the second insulation layer.

It is also preferred that the step of forming a first insulation layer includes performing an atomic layer deposition (ALD) or an ion beam deposition (IBD) using a beam with a low incident angle.

It is further preferred that the step of forming a second insulation layer includes performing an IBD using a beam with an incident angle substantially perpendicular to the layer lamination plane, or performing a straight sputtering with an incident angle substantially perpendicular to the layer lamination plane.

It is also preferred that a TMR multi-layered film or a CPP-GMR multi-layered film is formed as the MR multi-layered film.

According to the present invention, also, a manufacturing method of a thin-film magnetic head with an MR element in which current flows in a direction perpendicular to a layer lamination plane, includes a step of forming on a lower electrode layer an MR multi-layered structure with side surfaces substantially perpendicular to the layer lamination plane, a step of forming a first insulation layer on at least the side surfaces of the formed MR multi-layered structure, a step of forming a second insulation layer and a magnetic domain control bias layer on the lower electrode layer, and a step of forming an upper electrode layer on the MR multi-layered structure and the magnetic domain control bias layer.

According to the present invention, further, a thin-film magnetic head having an MR element in which current flows in a direction perpendicular to a layer lamination plane, includes a lower electrode layer, an MR multi-layered structure formed on the lower electrode layer and having side surfaces substantially perpendicular to the layer lamination plane, a first insulation layer formed on at least the side surfaces of the formed MR multi-layered structure, a magnetic domain control bias layer magnetically coupled to the MR multi-layered structure through the first insulation layer, a second insulation layer formed under the magnetic domain control bias layer, and an upper electrode layer formed on the MR multi-layered structure and the magnetic domain control bias layer.

Because the side surfaces of the MR multi-layered structure are substantially perpendicular to the layer lamination plane, the second insulation layer and also the magnetic domain control bias layer formed thereon are hardly deposited on the side surfaces of the MR multi-layered structure. Thus, the upper surface of the formed magnetic domain control bias layer becomes almost flat.

Because the side surfaces are substantially perpendicular to the layer lamination plane, the second insulation layer is hardly deposited on the side surfaces. Thus, the first insulation layer for electrically insulating the side surfaces of the TMR multi-layered structure from the magnetic domain control bias layer is formed on these side surfaces in a deposition process different from that of the second insulation layer. Since the first insulation layer is deposited in the different process from the second insulation layer, this first insulation layer can be formed to have a quite thinner thickness than that of the second insulation layer. As a result, it is possible to increase the magnetic coupling between the magnetic domain control bias layer and the magnetization free layer of the TMR multi-layered structure so as to perform sufficient magnetic domain control of the free layer.

It is preferred that the first insulation layer is thinner than the second insulation layer.

It is also preferred that the MR multi-layered structure is a TMR multi-layered structure or a CPP-GMR multi-layered structure.

Further objects and advantages of the present invention will be apparent from the following description of the preferred embodiments of the invention as illustrated in the accompanying drawings.

DESCRIPTION OF THE PREFERRED EMBODIMENTS

Figure 1:
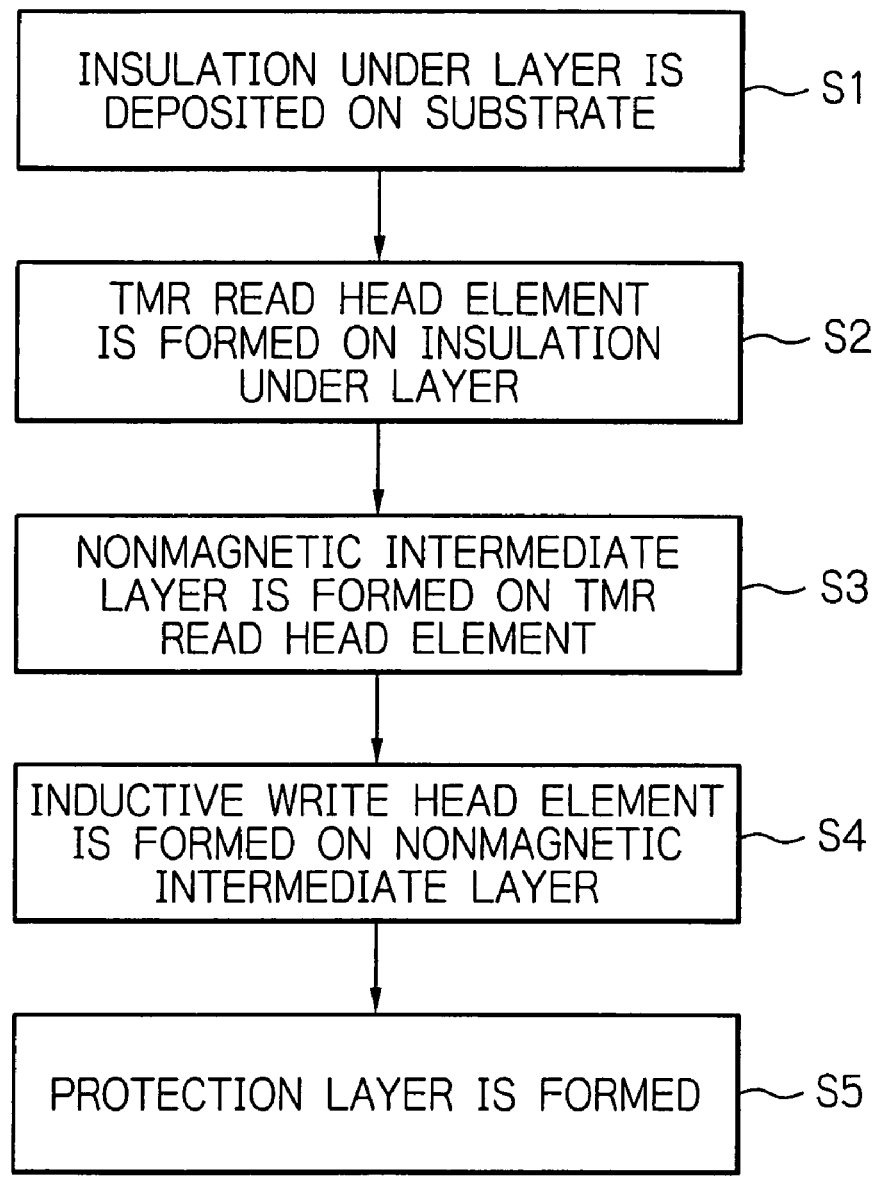
FIG. 1 is a flowchart illustrating a process for manufacturing a thin-film magnetic head according to an embodiment of the present invention.
Figure 2:
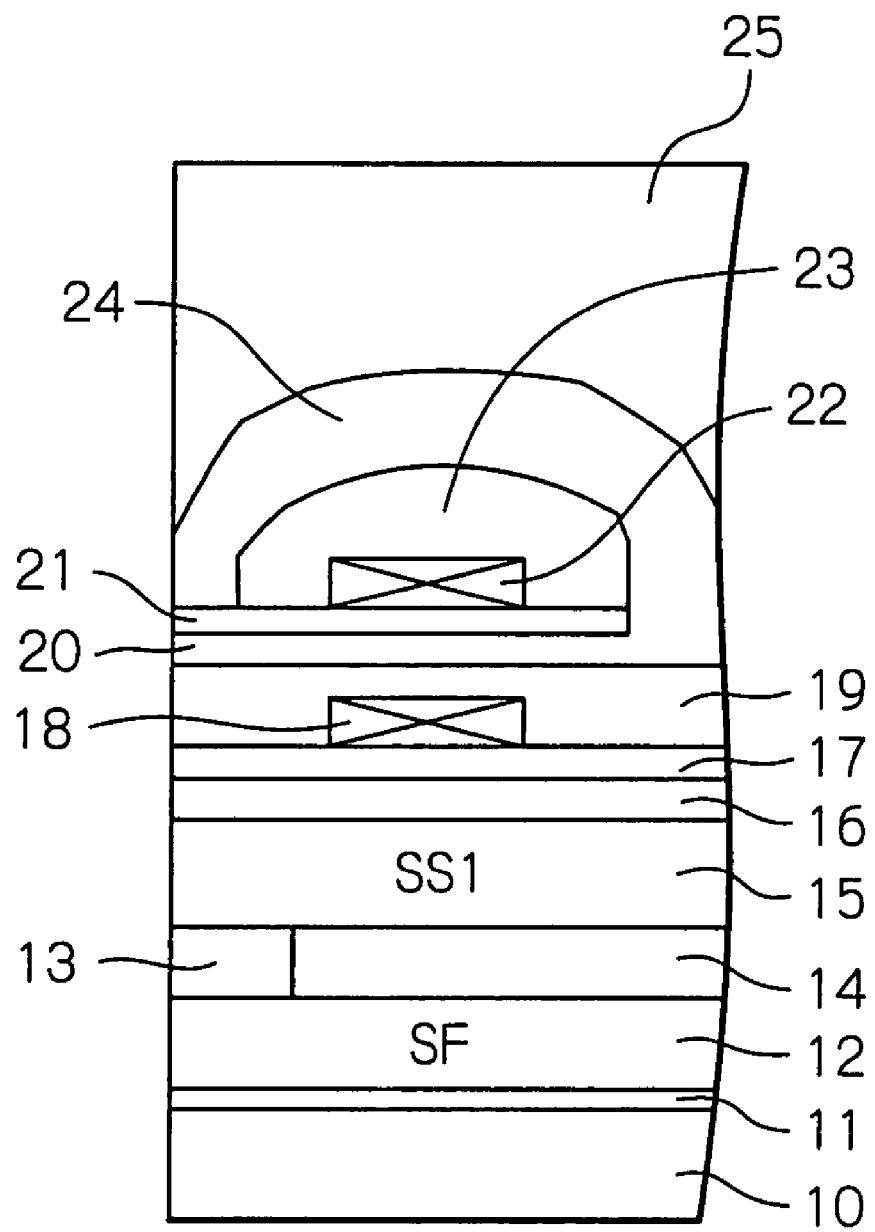
FIG. 2 is a cross-sectional view schematically illustrating a configuration of a thin-film magnetic head manufactured according to the embodiment shown in FIG. 1.
Figure 3:
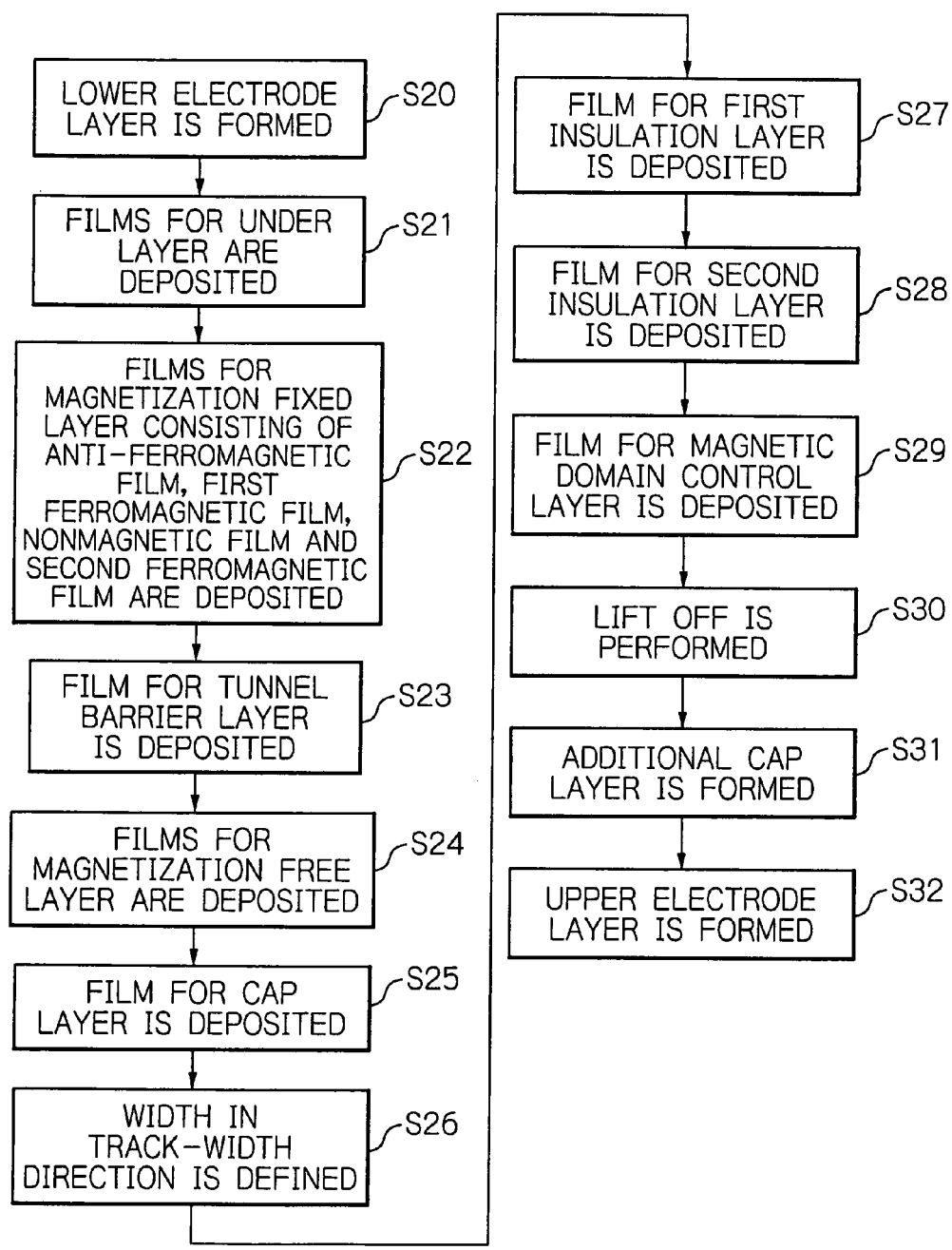
FIG. 3 is a flowchart illustrating in greater detail the step of manufacturing a read head element in the manufacturing process shown in FIG. 1.

FIG. 1 illustrates a process for manufacturing a thin-film magnetic head according to an embodiment of the present invention, FIG. 2 schematically illustrates a configuration of the thin-film magnetic head manufactured according to the embodiment shown in FIG. 1, FIG. 3 illustrates in further detail the step of manufacturing a read head element in the manufacturing process shown in FIG. 1, and FIGS. 4a to 4g illustrate the manufacturing process shown in FIG. 3. It should be noted that FIG. 2 shows a cross section of the thin-film magnetic head that is perpendicular to the ABS and track-width direction of the thin-film magnetic head, and that FIGS. 4a-4g show cross-sections that are parallel to the ABS of the thin-film magnetic head.

While a TMR thin-film magnetic head is manufactured in this embodiment, a GMP thin-film magnetic head having a CPP structure can be manufactured by the basically same process except that a nonmagnetic conducting layer is formed instead of a tunnel barrier layer.

As shown in FIGS. 1 and 2, a substrate or wafer 10 made of a conductive material such as AlTiC ($Al_2O_3$—TiC) is prepared first, and an insulation under layer 11 of an insulation material such as alumina ($Al_2O_3$) or silicon oxide ($SiO_2$) is deposited on the substrate 10 to have a thickness in the range from approximately 0.05 to 10 μm by a sputtering method for example (Step S1).

Then, a TMR read head element including a lower electrode layer 12 that also acts as a lower shield layer (SF), a TMR multi-layered structure 13, an insulation layer 14, a magnetic domain control bias layer 48' (see FIGS. 4f and 4g), and an upper electrode layer 15 that also acts as an upper shield layer (SS1) is formed on the insulation under layer 11 (Step S2). A process for manufacturing the TMR read head element will be described later in detail.

Then, a nonmagnetic intermediate layer 16 is formed on the TMR read head element (Step S3). The nonmagnetic intermediate layer 16 is a layer made of an insulation material such as $Al_2O_3$, $SiO_2$, aluminum nitride (AlN) or diamond-like carbon, or a metal material such as tantalum (Ta) or platinum (Pt) with a thickness in the range from approximately 0.1 to 0.5 μm and formed by for example a sputtering method or chemical vapor deposition (CVD) method. The nonmagnetic intermediate layer 16 separates the TMR read head element from an inductive write head element that will be formed on it.

Then, the inductive write head element including an insulation layer 17, a backing coil layer 18, a backing coil insulation layer 19, a main pole layer 20, an insulation gap layer 21, a write coil layer 22, a write coil insulation layer 23 and an auxiliary pole layer 24 is formed on the nonmagnetic intermediate layer 16 (Step S4). The inductive write head element in this embodiment has a perpendicular magnetic recording structure. However, it will be apparent that an inductive write head element having a horizontal or in-plane magnetic recording structure can be used. It will be also apparent that the perpendicular magnetic recording structure of the inductive write head element is not limited to the structure shown in FIG. 2 but instead any of various other structures can be used.

The insulation layer 17 is formed by depositing an insulation material such as $Al_2O_3$ or $SiO_2$ on the nonmagnetic intermediate layer 16 by using a sputtering method, for example. The upper surface of the insulating layer 17 is planarized by CMP, for example, as required. Formed on the insulation layer 17 is the baking coil layer 18 of a conductive material such as Cu by using such as a frame plating method to have a thickness in the range from approximately 1 to 5 μm. The purpose of the backing coil layer 18 is to guide a write magnetic-flux so as to prevent adjacent track erasure (ATE). The backing coil insulation layer 19 is formed to have a thickness in the range from approximately 0.5 to 7 μm by photolithography a thermoset novolac resist so as to cover the backing coil layer 18.

The main magnetic pole layer 20 is formed on the backing coil insulation layer 19. The main magnetic pole layer 20 acts as a magnetic path for converging and guiding a magnetic flux induced by the write coil layer 22 to a perpendicular recording layer of a magnetic disk on which data is to be written. The main magnetic pole layer 20 is made of a metal magnetic material such as FeAlSi, NiFe, CoFe, NiFeCo, FeN, FeZrN, FeTaN, CoZrNb or CoZrTa, or a multi-layered film including these to have a thickness in the range from approximately 0.5 to 3 μm by such as a frame plating method.

The insulation gap layer 21 is formed on the main magnetic pole layer 20 by depositing an insulating film of a material such as $Al_2O_3$ or $SiO_2$ by using such as a sputtering method. Formed on the insulation gap layer 21 is the write coil insulation layer 23 of a thermoset novolac resist for example with a thickness in the range from approximately 0.5 to 7 μm. The write coil layer 22 of a conductive material such as Cu with a thickness of approximately 1 to 5 μm is formed inside the write coil insulation layer 23 by such as a frame plating method.

The auxiliary magnetic pole layer 24 of a metal magnetic material such as FeAlSi, NiFe, CoFe, NiFeCo, FeN, FeZrN, FeTaN, CoZrNb or CoZrTa, or a multi-layered film of any of these materials with a thickness of approximately 0.5 to 3 μm is formed by such as a frame plating method so as to cover the write coil insulation layer 23. The auxiliary magnetic pole layer 24 forms a return yoke.

Then, a protection layer 25 is formed on the inductive write head element (Step S5). The protection layer 25 may be formed by depositing a material such as $Al_2O_3$ or $SiO_2$ using a sputtering method.

This completes the wafer process for the thin-film magnetic head. The subsequent processes for manufacturing the thin-film magnetic head such as a machining process are well known and therefore the description of which will be omitted.

A process for manufacturing a TMR read head element will be described in detail with reference to FIGS. 3 and FIGS. 4a to 4g.

First, a lower electrode layer 12 that also acts as a lower shield layer is formed on the insulation under layer 11 shown in FIG. 2 (Step S20). The lower electrode layer 12 may be made of a metal magnetic material such as FeAlSi, NiFe, CoFe, FeNiCo, FeN, FeZrN, FeTaN, CoZrNb or CoZrTa by a frame plating method to have a thickness of approximately 0.1 to 3 μm.

Then, on the lower electrode layer 12, films 40 for a multi-layered under layer are deposited by a sputtering method for example (Step S21). The films 40 for a multi-layered under layer consist of a first under layer made of a material such as tantalum (Ta), chromium (Cr), hafnium (Hf), niobium (Nb), zirconium (Zr), titanium (Ti), molybdenum (Mo) or tungsten (W) with a thickness in the range from approximately 0.5 to 5 nm, and a second under layer made of a material such as NiCr, NiFe, NiFeCr, (ruthenium) Ru, cobalt (Co) or CoFe with a thickness in the range from approximately 1 to 5 nm.

Then, films 41 for a magnetization fixed layer are deposited on the films 40 for the multi-layered under layer (Step S22). The films 41 for the magnetization fixed layer in this embodiment are of synthetic type, formed by depositing in this order, using a sputtering method for example, an anti-ferromagnetic film (film for pinning layer) of a material such as IrMn, PtMn, NiMn or RuRhMn with a thickness of approximately 5 to 30 nm, a first ferromagnetic film of a material such as CoFe with a thickness of approximately 1 to 5 nm, a nonmagnetic film of an alloy of one or more of materials such as Ru, rhodium (Rh), iridium (Ir), Cr, rhenium (Re) and copper (Cu) with a thickness of approximately 0.8 nm, and a second ferromagnetic film of material such as CoFe, CoFeSi, CoMnGe, CoMnSi or CoMnAl with a thickness of approximately 1 to 3 nm.

Then, a film 42 for a tunnel barrier layer, made of oxidation of an aluminum (Al), titanium (Ti), Ta, Zr, Hf, magnesium (Mg), silicon (Si) or zinc (Zn) with a thickness of approximately 0.5 to 1 nm is deposited on the films 41 for the magnetization fixed layer by such as a sputtering method (Step S23).

Thereafter, films 43 for a magnetization free layer (free layer) are deposited on the film 42 for the tunnel barrier layer by sputtering for example a high-polarizability film of a material such as CoFe, CoFeSi, CoMnGe, CoMnSi or CoMnAl with a thickness of approximately 1 nm and a soft magnetic film of a material such as NiFe with a thickness of approximately 1 to 9 nm in this order (Step S24).

Figure 4A:
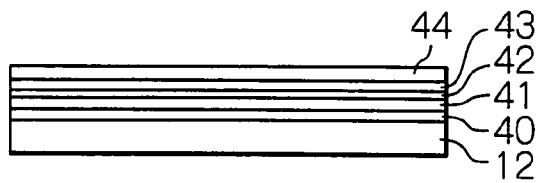
FIGS. 4a to 4g show cross-sectional views illustrating the manufacturing process shown in FIG. 3.

Then, a film 44 for a thin cap layer consisting of one or more layers of a nonmagnetic conductive material such as Ta, Ru, Hf, Nb, Zr, Ti, Cr or W with a thickness of approximately 1 to 10 nm is deposited by such as a sputtering method (Step S25). FIG. 4a shows the TMR multi-layered film formed as a result of the steps described thus.

Figure 4B:
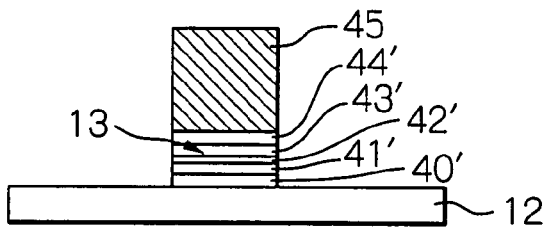

Then, a patterning process is performed to define or adjust the width in the track width direction of the TMR multi-layered film thus formed (Step S26). Namely, at this step S26, first, a mask 45 having a resist pattern used for lift off is formed on the multi-layered film, and then ion beam etching with for example Ar ions, which travel in straight lines and have the incident angle with normal to the layer lamination plane, through the mask 45 to the TMR multi-layered film is performed. As a result of this milling, the TMR multi-layered structure 13 with side surfaces in the track width direction, which are substantially perpendicular to the layer lamination plane can be obtained. It is desired to use a thinner mask 45 to have the side surfaces more closed to a perfect perpendicular to the layer lamination plane. If a reactive ion beam etching (RIE) process is performed, it is possible to obtain the side surfaces more closed to a perfect perpendicular to the layer lamination plane without using the thinner mask. FIG. 4b shows thus patterned state. In the figure, reference numeral 40' denotes a patterned multi-layered under layer, 41' denotes a patterned magnetization fixed layer, 42' denotes a patterned tunnel barrier layer, 43' denotes a patterned magnetization free layer and 44' denotes a patterned cap layer, respectively.

Figure 4C:
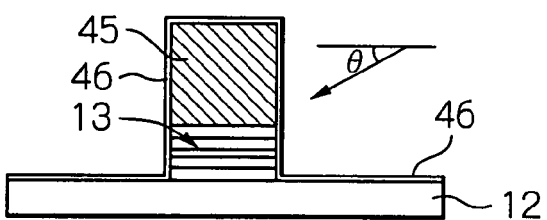

Then, a film 46 for a very thin first insulation layer with a thickness of about 1 to 3 nm for example is deposited thereon (Step S27). This deposition is performed by depositing an insulation material such as $Al_2O_3$ or $SiO_2$ using ALD or low incident angle IBD in order to form insulation films particularly on the side surfaces of the TMR multi-layered structure 13. The ALD is an atomic layer deposition capable of uniformly fabricating a quite thin film such as an oxidized film with no pinhole. The low incident angle IBD is an ion beam deposition using a beam with a low incident angle θ of 0 to 65 degrees for example (see FIG. 4c). Both of these ALD and low incident angle IBD can deposit a quite thin film on the side surfaces of the TMR multi-layered structure 13, which surfaces are substantially perpendicular to the layer lamination plane. Thus, as shown in FIG. 4c, a quite thin film 46 for the first insulation layer is deposited on the mask 45, on the side surfaces of the TMR multi-layered structure 13, and on a part of the upper surface of the lower electrode layer 12, on which part the TMR multi-layered 13 is not formed.

Figure 4D:
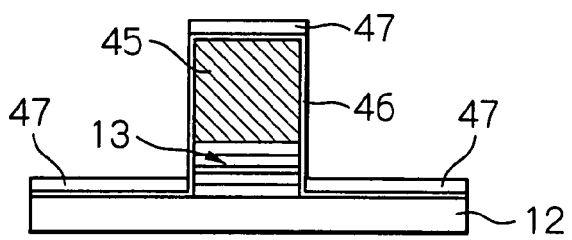

Then, a film 47 for a second insulation layer that is thicker than the film 46 for the first insulation layer and has a thickness of about 3 to 20 nm for example is deposited thereon (Step S28). This deposition is performed in order to form an under film for magnetic domain control bias layer by depositing an insulation material such as $Al_2O_3$ or $SiO_2$ using beam substantially perpendicular to the layer lamination plane. More concretely, the deposition is performed by IBD using a beam with the incident angle substantially perpendicular to the layer lamination plane, or by straight sputtering with the incident angle substantially perpendicular to the layer lamination plane. Thus, as shown in FIG. 4d, the film 47 for the second insulation layer is deposited on the film 46 for the first insulation layer on the mask 45, and on a part of the film 45 for the first insulation layer, on which part the TMR multi-layered 13 is not formed. However, on the side surfaces of the TMR multi-layered structure 13, the film 47 for the second insulation layer is hardly deposited.

Figure 4E:
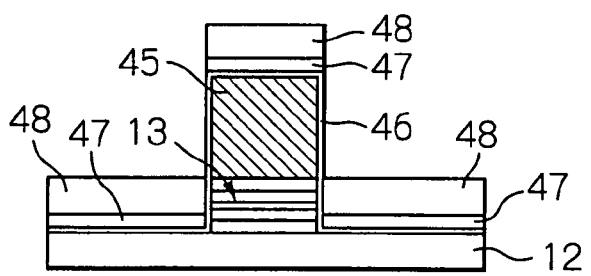

Next, a film 48 with a thickness of about 10 to 40 nm for a magnetic domain control bias layer is deposited (Step S29). This deposition is performed by depositing a hard magnetic material such as CoFe, NiFe, CoPt or CoCrPt, using beam substantially perpendicular to the layer lamination plane. More concretely, the deposition is performed by IBD using a beam with the incident angle substantially perpendicular to the layer lamination plane, or by straight sputtering with the incident angle substantially perpendicular to the layer lamination plane. Thus, as shown in FIG. 4e, the film 48 for the magnetic domain control bias layer is deposited on the film 47 for the second insulation layer on the mask 45, and on a part of the film 47 for the second insulation layer, on which part the TMR multi-layered 13 is not formed. However, on the side surfaces of the TMR multi-layered structure 13, the film 48 for the magnetic domain control bias layer is hardly deposited.

Figure 4F:
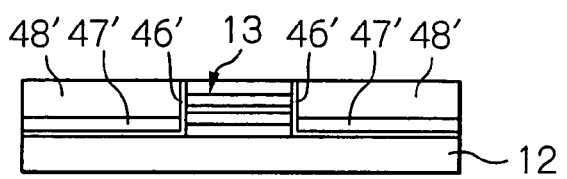

Thereafter, lift off process is performed by removing the mask 45 (Step S30). Thus, as shown in FIG. 4f, the first insulation layer 46t', the second insulation layer 47' and the magnetic domain control bias layer 48' are formed. Because the side surfaces of the TMR multi-layered structure 13 are substantially perpendicular to the layer lamination plane, the second insulation layer 47' and also the magnetic domain control bias layer 48' are hardly deposited on these side surfaces of the TMR multi-layered structure 13. Therefore, the upper surfaces of the TMR multi-layered structure 13 and the magnetic domain control bias layer 48' are almost planarized only by performing the lift off process. Thus, no planarization process such as CMP process is necessary to do. However, in order to more planarize the upper surfaces, the CPM process may be additionally performed. In the later case, simple CMP process will result good planarized upper surfaces.

Then, an additional cap layer 49 made of a nonmagnetic conductive material such as Ta, Ru, Hf, Nb, Zr, Ti, Cr or W with a thickness of about 0 to 30 nm and provided with a single or two layered structure is deposited by such as a sputtering method on the TMR multi-layered structure 13, the first insulation layer 46', the second insulation layer 47' and the magnetic domain control bias layer 48' (Step S31).

Figure 4G:
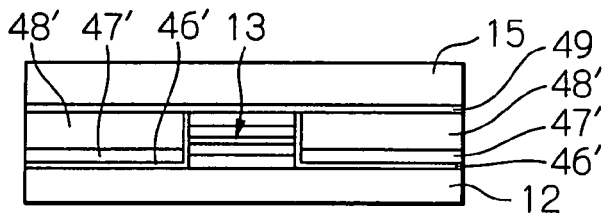

Thereafter, an upper electrode layer 15, which also acts as an upper shied layer (SS1), of a metal magnetic material such as FeAlSi, NiFe, CoFe, NiFeCo, FeN, FeZrN, FeTaN, CoZrNb or CoZrTa with a thickness of approximately 0.1 to 3 μm is formed on the additional cap layer 49 by such as a frame plating method (Step S32). FIG. 4g shows this state.

The layer structure, material and thickness of each of the magnetization fixed layer, barrier layer and the magnetization free layer that constitute the magneto-sensitive portion of the TMR multi-layered structure 13 are not limited to that described above, but various materials and thicknesses may be optionally adopted. For example, the magnetization fixed layer is not limited to the three-layered films plus the anti-ferromagnetic film, but may be formed from a single-layer film made of a ferromagnetic film plus the anti-ferromagnetic film, or multi-layered films other than three films plus the anti-ferromagnetic film. The magnetization free layer is not limited to the two-layered films, but may be formed from a single-layer film other than the high-polarizability film or multi-layered films of more than two films with a magneto-striction control film. Furthermore, the magnetization fixed layer, barrier layer and magnetization free layer of the magneto-sensitive portion may be formed in the inverse order, that is, in the order of the magnetization free layer, the barrier layer and the magnetization fixed layer from the bottom. In that case, the anti-ferromagnetic film in the magnetization fixed layer will be positioned at the top.

As has been described above, according to this embodiment, because the side surfaces of the TMR multi-layered structure 13 are substantially perpendicular to the layer lamination plane, the upper surfaces of the TMR multi-layered structure 13 and the magnetic domain control bias layer 48' are almost planarized only by performing the lift off process. Thus, no planarization process such as CMP process is necessary to perform. Because of substantially perpendicular to the layer lamination plane, no second insulation layer 47' is deposited on the side surfaces. Thus, the first insulation layer 46' for electrically insulating the side surfaces of the TMR multi-layered structure 13 from the magnetic domain control bias layer 48' is formed on these side surfaces in a deposition process different from that of the second insulation layer 47'. Since the first insulation layer 46' is deposited in the different process from the second insulation layer 47', this first insulation layer 46' can be formed to have a quite thinner thickness than that of the second insulation layer 47'. As a result, it is possible to increase the magnetic coupling between the magnetic domain control bias layer 48' and the magnetization free layer 43' of the TMR multi-layered structure 13 so as to perform sufficient magnetic domain control of the free layer 43'. Further, since the second insulation layer 47' is deposited in the different process from the first insulation layer 46', a thickness of the second insulation layer 47' can be optionally adjusted so that the position of the magnetic domain control bias layer 48' along the thickness coincides to that of the magnetization free layer 43' of the TMR multi-layered structure 13. The first insulation layer 46' and the second insulation layer 47' also act to electrically insulate the magnetic domain control bias layer 48' from the lower electrode layer 12.

A part of the first insulation layer 46' located in a region just under the second insulation layer 47' can be omitted. If a film 46 for the first insulation layer is deposited by using a low incident angle IBD with θ=0 for example, such state will be obtained.

It is desired that a film 46 for the first insulation layer and a film 47 for the second insulation layer be sequentially deposited using the same deposition device. In this case, the order of depositions between the films 46 and 47 is not important. A film 46 for the first insulation layer and a film 47 for the second insulation layer may be deposited using different deposition devices, or using the same deposition device but the device is opened to atmosphere between the depositions. In the latter two cases, it is desired that a film 46 for the first insulation layer is deposited first and then a film 47 for the second insulation layer is deposited.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A manufacturing method of a magnetoresistive effect element in which current flows in a direction perpendicular to a layer lamination plane, comprising the steps of:
   forming on a lower electrode layer a magnetoresistive effect multi-layered structure with side surfaces perpendicular to the layer lamination plane;
   forming a first insulation layer on at least the side surfaces of the formed magnetoresistive effect multi-layered structure;
   forming a second insulation layer on said lower electrode layer;
   forming a magnetic domain control bias layer on said second insulation layer; and
   forming an upper electrode layer on said magnetoresistive effect multi-layered structure and said magnetic domain control bias layer.

2. The manufacturing method as claimed in claim 1, wherein the step of forming a second insulation layer is performed after the step of forming a first insulation layer.

3. The manufacturing method as claimed in claim 1, wherein the step of forming a second insulation layer is performed before the step of forming a first insulation layer.

4. The manufacturing method as claimed in claim 1, wherein the step of forming a magnetoresistive effect multi-layered structure comprises depositing on the lower electrode layer a magnetoresistive effect multi-layered film, forming a mask on the deposited magnetoresistive effect multi-layered film, and milling through said mask using beam in a direction substantially perpendicular to the layer lamination plane so as to form said magnetoresistive effect multi-layered structure with said side surfaces.

5. The manufacturing method as claimed in claim 4, wherein the step of forming a first insulation layer comprises depositing a film for the first insulation layer on at least the side surfaces of the formed magnetoresistive effect multi-layered structure through said mask, and forming the first insulation layer by performing a lift off process of said mask.

6. The manufacturing method as claimed in claim 5, wherein the step of forming a second insulation layer and a magnetic domain control bias layer comprises depositing a film for the second insulation layer and a film for the magnetic domain control bias layer through said mask, and forming the second insulation layer and the magnetic domain control bias layer by performing a lift off process of said mask.

7. The manufacturing method as claimed in claim 6, wherein upper surfaces of said magnetoresistive effect multi-layered structure and said magnetic domain control bias layer are planarized by performing the lift off process of said mask.

8. The manufacturing method as claimed in claim 1, wherein upper surfaces of said magnetoresistive effect multi-layered structure and said magnetic domain control bias layer are planarized by performing a chemical-mechanical polishing process.

9. The manufacturing method as claimed in claim 1, wherein said first insulation layer is formed thinner than said second insulation layer.

10. The manufacturing method as claimed in claim 1, wherein the step of forming a first insulation layer comprises performing an atomic layer deposition or an ion beam deposition using a beam with a low incident angle.

11. The manufacturing method as claimed in claim 10, wherein the step of forming a second insulation layer comprises performing an ion beam deposition using a beam with an incident angle substantially perpendicular to the layer lamination plane.

12. The manufacturing method as claimed in claim 10, wherein the step of forming a second insulation layer comprises performing a straight sputtering with an incident angle substantially perpendicular to the layer lamination plane.

13. The manufacturing method as claimed in claim 1, wherein the step of forming a magnetoresistive effect multi-layered structure comprises forming a tunnel magnetoresistive effect multi-layered structure or a current-perpendicular-to-plane giant magnetoresistive effect multi-layered structure.

14. A manufacturing method of a thin-film magnetic head with a magnetoresistive effect element in which current flows in a direction perpendicular to a layer lamination plane, comprising the steps of:
   forming on a lower electrode layer a magnetoresistive effect multi-layered structure with side surfaces perpendicular to the layer lamination plane;
   forming a first insulation layer on at least the side surfaces of the formed magnetoresistive effect multi-layered structure;
   forming a second insulation layer on said lower electrode layer;
   forming a magnetic domain control bias layer on said second insulation layer; and
   forming an upper electrode layer on said magnetoresistive effect multi-layered structure and said magnetic domain control bias layer.

* * * * *